United States Patent
Cordes

(10) Patent No.: US 10,881,035 B2
(45) Date of Patent: Dec. 29, 2020

(54) COMPACT, LIGHTWEIGHT SHIELDED ENCLOSURES AND RELATED METHODS

(71) Applicant: Marc Cordes, Arlington, VA (US)

(72) Inventor: Marc Cordes, Arlington, VA (US)

(73) Assignee: Intech Defense, Inc., Chantilly, VA (US)

( * ) Notice: Subject to any disclaimer, the term of this patent is extended or adjusted under 35 U.S.C. 154(b) by 0 days.

(21) Appl. No.: 16/413,586

(22) Filed: May 15, 2019

(65) Prior Publication Data

US 2019/0357393 A1   Nov. 21, 2019

Related U.S. Application Data

(60) Provisional application No. 62/671,433, filed on May 15, 2018.

(51) Int. Cl.
*H05K 9/00* (2006.01)
*E04B 1/92* (2006.01)

(52) U.S. Cl.
CPC .............. *H05K 9/0001* (2013.01); *E04B 1/92* (2013.01)

(58) Field of Classification Search
CPC .......................... H05K 9/0001; H05K 9/0003
See application file for complete search history.

(56) References Cited

U.S. PATENT DOCUMENTS

| | | | |
|---|---|---|---|
| 7,385,147 B2 * | 6/2008 | Garmong | H05K 9/0001 174/364 |
| 2007/0002547 A1 * | 1/2007 | Garmong | H05K 9/0001 361/752 |
| 2014/0346815 A1 * | 11/2014 | Keutz | B62D 25/20 296/193.07 |

OTHER PUBLICATIONS

Definition of portable, bing.com, date Jan. 20, 2020, 1 page (Year: 2020).*

* cited by examiner

*Primary Examiner* — Hung V Ngo

(57) ABSTRACT

Compact, integral and ergonomic lightweight shielded enclosures provide a high level of acoustic, RF, EMI, EMP and CBR protection.

6 Claims, 18 Drawing Sheets

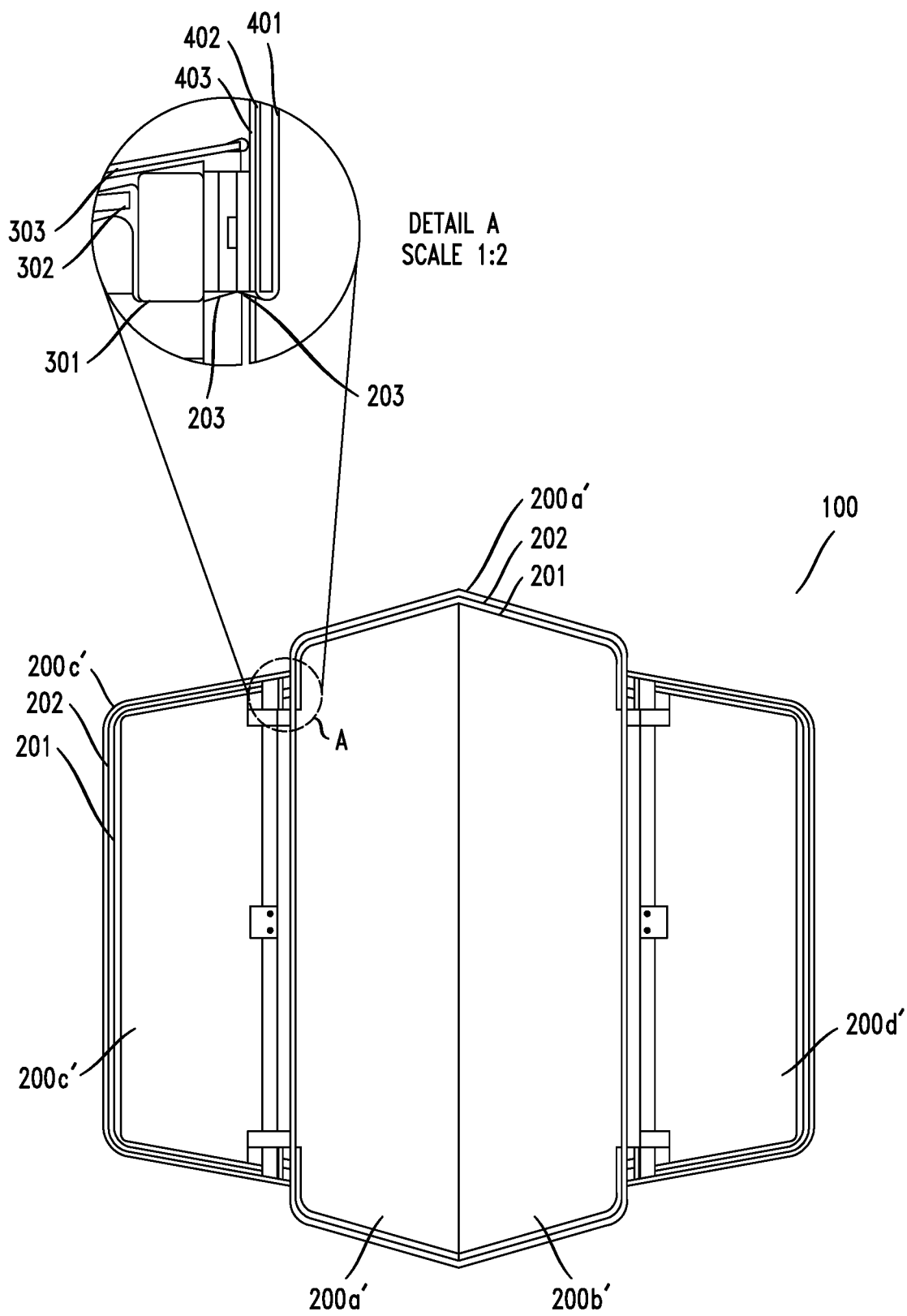

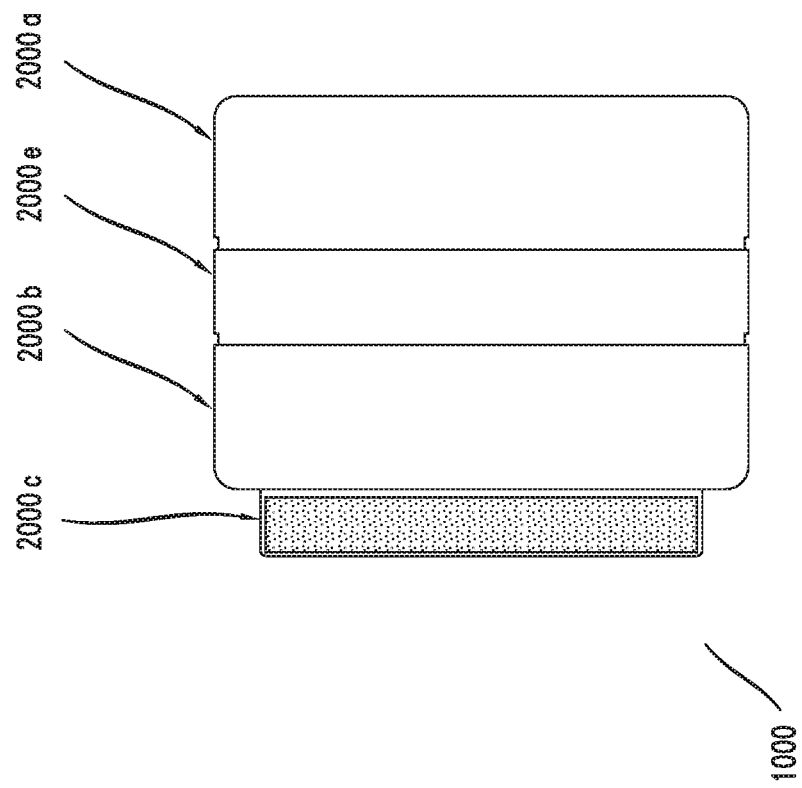

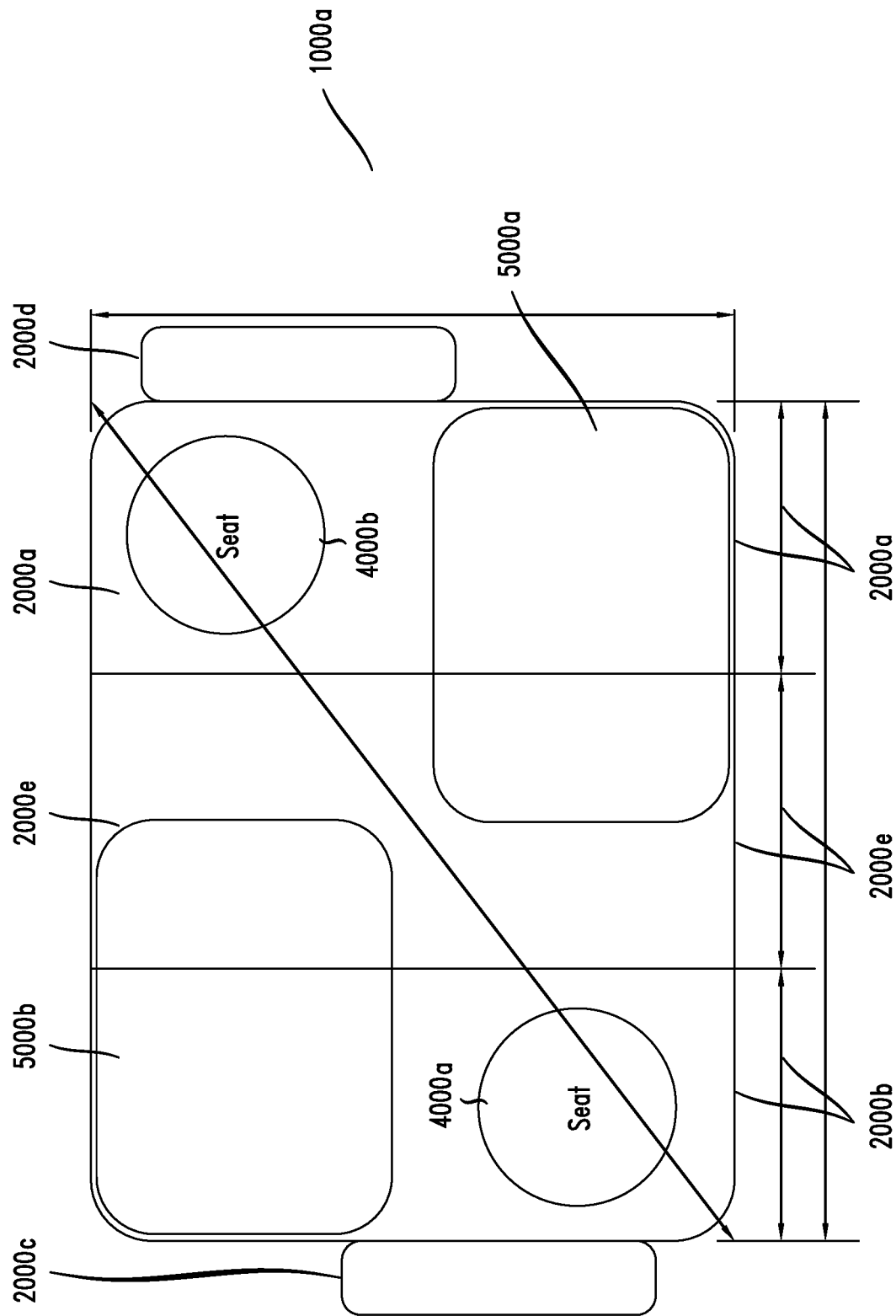

TOP VIEW

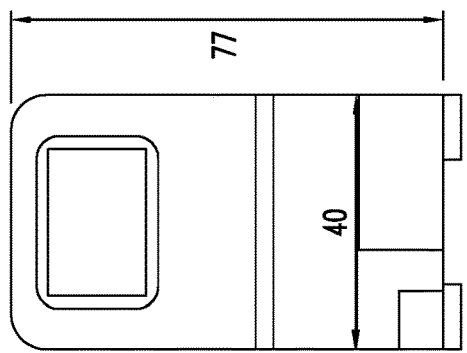
FIG. 7B
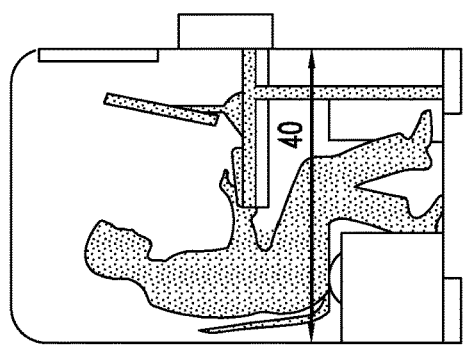
FIG. 7C
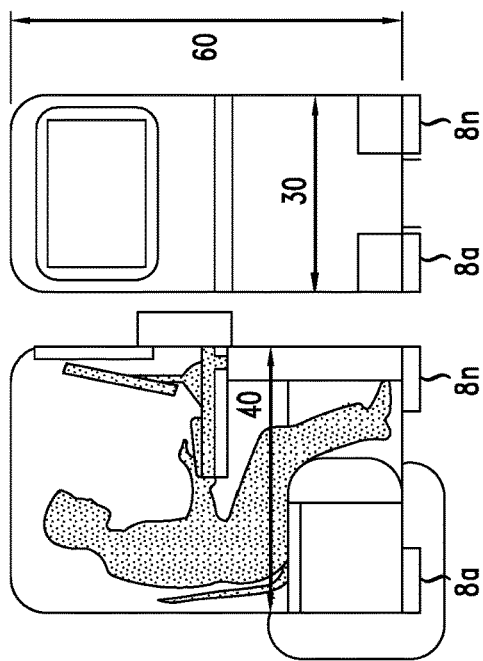
FIG. 7D
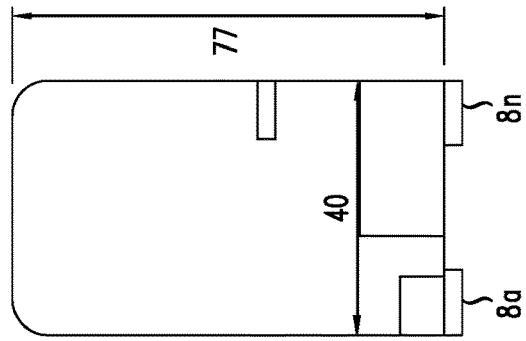

COMPACT, LIGHTWEIGHT SHIELDED ENCLOSURES AND RELATED METHODS

RELATED APPLICATION

This application claims priority to U.S. Provisional Application No. 62/671,433 filed May 15, 2018 (the "'433 Application"). This application incorporates by reference the entire disclosure of the '433 Application, including the text and drawings as if set forth in full herein.

INTRODUCTION

Keeping communications secret from an adversary or competitor has long been the challenge of the military as well as companies that are targets of corporate espionage. The challenge becomes even more difficult when communications are made from locations that do not have structures that have been built to prevent eavesdropping and the like. Further, when secret or secure communications are required a secure structure may be difficult to construct.

Secure enclosures that protect against acoustical eavesdropping, electromagnetic interference (EMI) and radio frequency interference (RF) have been in operation for more than fifty years. Typically, these enclosures are made of rigid metal panels, beams and doors that must be shipped to a site where they require a number of skilled experts to construct and erect such enclosures. More recently, shielded tents that can be transported in cases and quickly erected were introduced. Still, these tents may not provide the level of physical security required.

Still further, many times existing enclosures that use rigid metal panels and doors do not maintain their level of RF protection because their design makes them inherently susceptible to leakages over time. For example, many times the doors of an existing enclosure are so heavy that the hinges and other closure elements become loose or deformed after repeated usage. The result is that unwanted RF signals may penetrate through such leaks (or confidential communications may emanate from such leaks). To overcome such problems the elements (doors, hinges, so-called "finger stock") of existing enclosures must be constantly adjusted or replaced altogether). Yet further, many small enclosures are unpleasant to use as they often have unacceptable ventilation, lighting, space/sitting and often can give a sensation of claustrophobia.

Accordingly, it is desirable to provide compact, (e.g., one or two person) lightweight and secure enclosures that provide at least the same level of acoustic, EMI/RF, Electromagnetic pulse (EMP) and infrared protection (i.e., attenuation) as existing enclosures, but overcome the problems associated with the existing enclosures.

SUMMARY

The present invention provides various embodiments for providing compact, integral lightweight enclosures that provide a high level of acoustic, EMI/RF, EMP and infrared protection, for example. The inventive enclosures are also ergonomically friendly and configured to reduce claustrophobia.

In an embodiment, one exemplary integral, lightweight radio-frequency (RF) and acoustically shielded enclosure may comprise: a plurality of lightweight housings forming a structure connected together for providing at least physical security, the connected structure comprising at least one opening; an inner structure comprising a lightweight frame for supporting one or more RF attenuation layers for attenuating RF signals; one or more acoustical attenuation layers for attenuating acoustical signals; and a lightweight cover operable as a door to allow ingress to, and egress from, the enclosure through the at least one opening. In this embodiment) and others the lightweight housings may comprise a carbon fiber material or fiberglass, and the lightweight cover may comprise a carbon fiber material or fiberglass.

In another embodiment, an integral, lightweight radio-frequency (RF) and acoustically shielded enclosure may comprise: a plurality of lightweight housings forming a structure connected together for providing at least physical security, the connected structure comprising two openings; an inner structure comprising a lightweight frame for supporting one or more RF attenuation layers for attenuating RF signals; one or more acoustical attenuation layers for attenuating acoustical signals; and a plurality of lightweight covers, each operable as a door to allow ingress to, and egress from, the enclosure through one of the openings.

In yet another embodiment, an integral, lightweight radio-frequency (RF) and acoustically shielded enclosure may comprise: a plurality of lightweight housings forming a structure connected together for providing at least physical security, the connected structure comprising at least one opening; a spacer section configured between two of the housings; an inner structure comprising a lightweight frame for supporting one or more RF attenuation layers for attenuating RF signals; one or more acoustical attenuation layers for attenuating acoustical signals; and a lightweight cover operable as a door to allow ingress to, and egress from, the enclosure through the opening.

In still additional embodiments, an integral, lightweight radio-frequency (RF) and acoustically shielded enclosure may comprise a plurality of lightweight housings forming a structure connected together for providing at least physical security, the connected structure comprising two openings; a spacer section configured between two of the housings; an inner structure comprising a lightweight frame for supporting one or more RF attenuation layers for attenuating RF signals; one or more acoustical attenuation layers for attenuating acoustical signals; and a plurality of lightweight covers, each operable as a door to allow ingress to, and egress from, the enclosure through one of the openings.

BRIEF DESCRIPTION OF THE DRAWINGS

Exemplary embodiments of the invention are described herein and are shown by way of example in the drawings. Throughout the following description and drawings, like reference numbers/characters refer to like elements

FIGS. 5B and 5C depict details of the exemplary compact, lightweight shielded enclosure in FIG. 5A according to an embodiment of the invention.

FIGS. 6A to 6C depict exemplary compact, lightweight shielded enclosures according to embodiments of the invention.

FIGS. 7A to 7D depict exemplary dimensions of compact, lightweight shielded enclosures according to embodiments of the invention.

Figure 1:
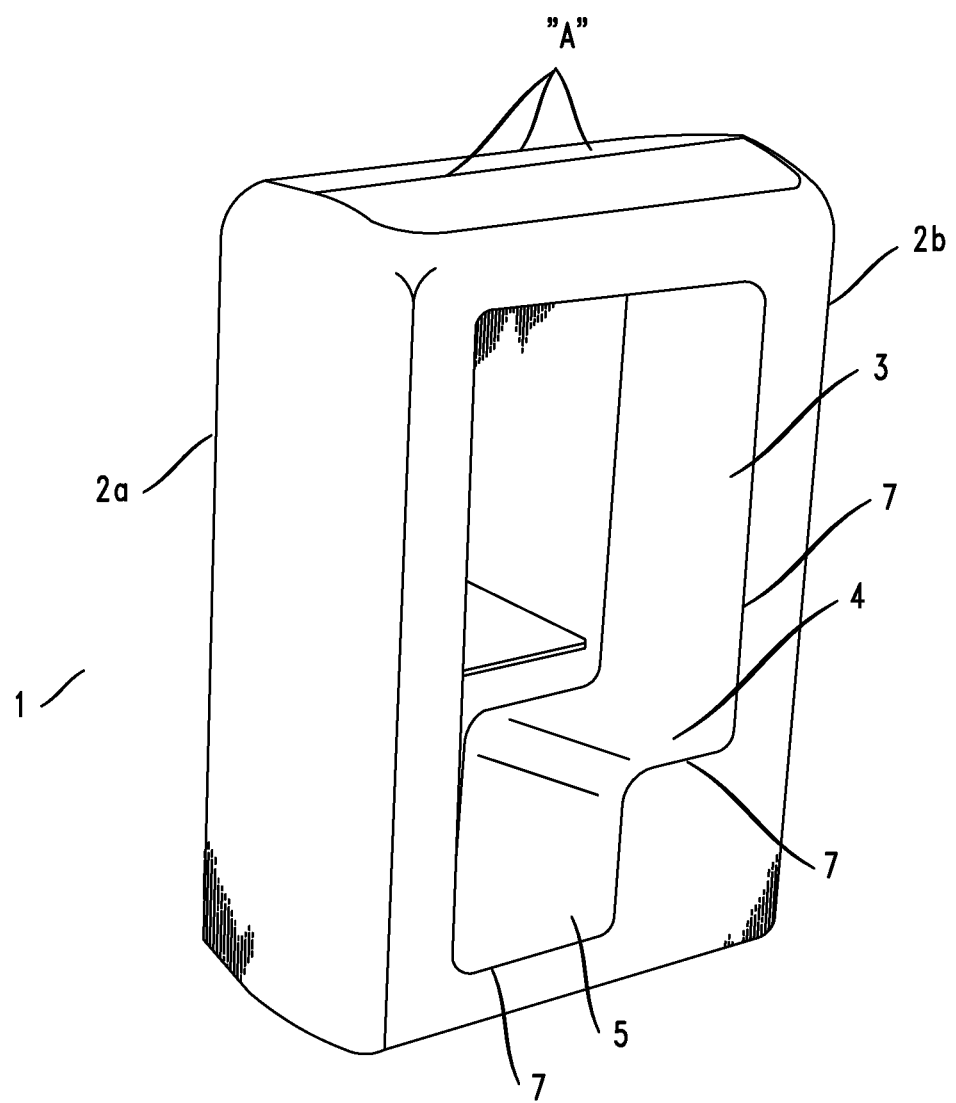
FIG. 1 depicts a compact, lightweight shielded enclosure according to an embodiment of the invention.

To the extent that any of the figures or text included herein depicts or describes dimensions, weights, or operating parameters it should be understood that such information is merely exemplary to aid the reader in understanding the embodiments described herein. It should be understood, therefore, that such information is provided to enable one skilled in the art to make and use an exemplary embodiment of the invention without departing from the scope of the invention.

DETAILED DESCRIPTION OF THE INVENTION, WITH EXAMPLES

It should be understood that, although specific exemplary embodiments are discussed herein, there is no intent to limit the scope of the present invention to such embodiments. To the contrary, it should be understood that the exemplary embodiments discussed herein are for illustrative purposes, and that modified and alternative embodiments may be implemented without departing from the scope of the present invention.

It should also be noted that one or more exemplary embodiments may be described as a process or method. Although a process/method may be described as sequential, it should be understood that such a process/method may be performed in parallel, concurrently or simultaneously. In addition, the order of each step within a process/method may be re-arranged. A process/method may be terminated when completed and may also include additional steps not included in a description of the process/method.

As used herein, the term "and/or" includes all combinations of one or more of the associated listed items. As used herein, the singular forms "a," "an" and "the" are intended to include the plural form, unless the context and/or common sense indicates otherwise. It should be further understood that the terms "comprises", "comprising,", "includes" and/or "including", when used herein, specify the presence of stated features, systems, subsystems, steps, operations, elements, and/or components, but do not preclude the presence or addition of one or more other features, systems, subsystems, steps, operations, elements, components, and/or combinations thereof.

As used herein, the designations "first", "second", etc., is purely to distinguish one component (e.g., element, component, side, etc.,) or part of a process from another and does not indicate an importance, priority or status. In fact, the component or parts of a process could be re-designated (i.e., re-numbered) and it would not affect the operation of the enclosures or methods provided by the present invention.

Yet further, when one part of an enclosure or system is described or depicted as being connected to another part using "a connection" (or single line in a figure) it should be understood that practically speaking such a connection (line) may comprise (and many times will comprise) more than one physical connection.

It should be noted that the enclosures and methods illustrated in the figures are not drawn to scale, are not representative of an actual shape or size and are not representative of any actual enclosure, system, layout, manufacture's drawing or visual. Rather, the enclosures and systems, etc., are drawn to simply help explain the features, functions and processes of exemplary embodiments of the present invention described herein and covered by the claims set forth at the end of this description. It should be further understood that any dimensions, weights, sizes, are merely exemplary and non-limiting (unless otherwise indicated herein) and are presented to assist the reader and those skilled in the art to understand the features, functions and processes of exemplary embodiments of the present invention described herein and covered by the claims set forth at the end of this description.

The phrase "enclosure" means a structure comprising elements that satisfy at least the requirements of the following: (i) a Sensitive Compartmented Information Facility (SCIF), or a Telecommunications Electronics Material Protected from Emanating Spurious Transmissions (TEMPEST) SCIF, or a Temporary Secure Working Area (TWSA) or an equivalent or higher secured structure and (ii) military specification MIL-STD-188-125-2 (RF shielding), (iii) STC-30 (sound transmission) and (iv) the Technical Specification for Construction and Management of Sensitive Compartmented Information Facilities, Version 1.4, IC Tech Spec-for ICD/ICS 705 dated Sep. 28, 2017.

The phrases "interior", "inner" or "internal" mean inside or within an enclosure or a surface that can be touched by an individual inside an enclosure while the phrase "exterior", "outer" or "external" mean the opposite, i.e., outside an enclosure or a surface that cannot be touched by an individual while inside an enclosure.

As used herein, the term "embodiment" or "exemplary" refers to one example of the present invention.

As used herein the phrase "operable to" means "functions to".

The phrase "integral" means an enclosure that, though it comprises multiple elements, is configured as one unit such that when the enclosure arrives at a location where it is to be used, the elements making of up the enclosure do not have to be constructed—they are already constructed.

As used herein, the phrase "module" and "component" may be used synonymously herein. As used herein "lightweight" means hand-carriable by no more than two individuals. For example, a lightweight, compact enclosure that includes an integral, protective housing, inner structure (with a multi-beam frame) and door provided by the present invention may weigh less than 150 pounds (without electronics, communications, lighting, air circulatory systems installed).

FIG. 1 depicts a compact, lightweight shielded enclosure 1 according to an embodiment of the invention. As shown, the exemplary enclosure 1 may comprise a plurality of modules or components such as: a first lightweight, protective outer shell or housing 2a, a second lightweight, protective outer shell or housing 2b, an inner structure 3, personal support and sitting structure 4 (e.g., a seat) and a personal work surface 5. In an embodiment, the volume of space formed by, and within, the enclosure 1 may be sufficient to hold a single individual user though, as explained elsewhere herein, other exemplary enclosures may be configured to hold more than one individual (e.g., a second individual). In an embodiment, the lightweight, protective outer housings 2a, 2b provides a level of physical security (e.g., a would be intruder cannot easily destroy the outer shell to gain access to the interior of the enclosure) and stability to the enclosure 1. The housings 2a,2b may comprise a carbon fiber material, for example, that has a high modulus of section per pound and may be connected together along plane "A" using connection means such as latches, for example. In an embodiment, the two housings 2a,2b and the corresponding inner structure 3 (along with additional elements described herein) may form an integral, one-piece lightweight, shielded protective structure when fabricated such that when the enclosure 1 is shipped to a site where it is to be used there may be no need to construct the two housings and inner structure—they are already constructed.

The support structure 4 may comprise a carbon fiber or fiberglass that is extremely light weight. In an embodiment, the structure 4 may include structure that rotates a top portion of the structure as well as adjusts the height of the top portion as measured from the floor of the enclosure 1. These features allow for ease of entry and exit from the enclosure 1, for example. A replaceable padding or padded covering may be provided over the top portion (not shown in figure) for additional comfort or to absorb vibrations if the enclosure is used as a part of moving vehicle, for example.

Still further, the structure 4 may include a hollow cavity (not shown in figure) that functions to allow insertion of, and holding of, electronics that are operable to make the enclosure electronically secure and actively, acoustically secure (e.g. 10 amp power filter), provide communications (e.g., signal filters, 5 way Ethernet filters), uninterruptible power supply, battery, active sound unit and/or that holds equipment that assist in conditioning the air inside the enclosure 1 (e.g., fans, air filters, cooling unit, along with waveguide vents on input and exhaust trunks (not shown in Figures), high level air filtering intake cartridges), and/or functions as a physical and/or electronic safe for holding confidential documents and/or sensitive equipment. It should be understood, however, that the electronics and equipment just described may be configured as a part of another section other than structure 4 as well. As described further below, the enclosure 1 may further comprise one or more lights and light support structures (e.g., LED, ambient, reading light and "night" lights) and intensity controls and switches for illuminating the inside of the enclosure 1.

Figure 2A:
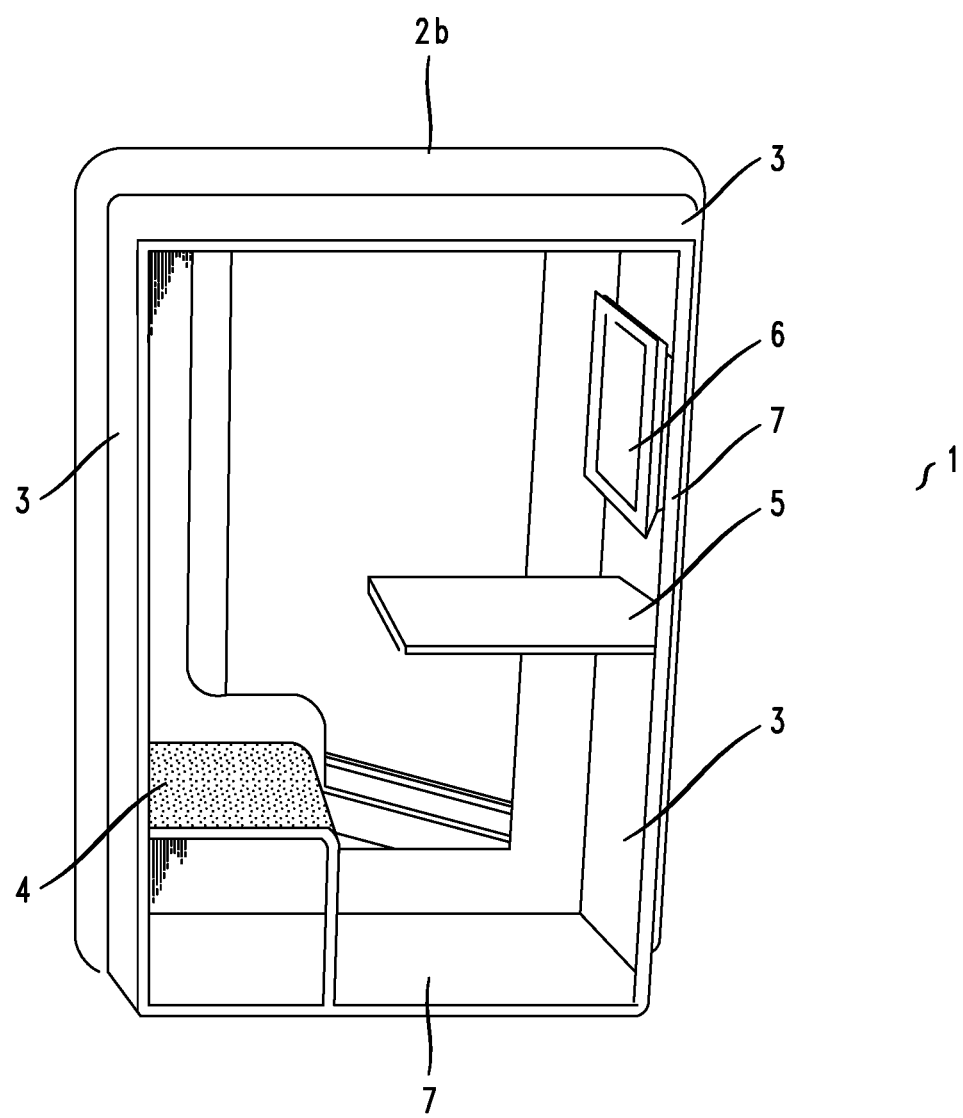
FIG. 2A depicts another view of a compact, lightweight shielded enclosure according to an embodiment of the invention.

FIG. 2A depicts a view of the interior of the compact, lightweight shielded enclosure 1 according to an embodiment of the invention. As shown the enclosure 1 may further comprise personal electronics, such as a computer (laptop, desktop), display/monitor and/or audio-visual equipment 6 operable to receive and send secure communications or relaxing entertainment content, for example. In addition, the equipment 6 may comprise video monitoring equipment (e.g., surveillance cameras) that may be positioned within the enclosure 1 as well as the outside surface of a housing 2a,2b.

Figure 2B:
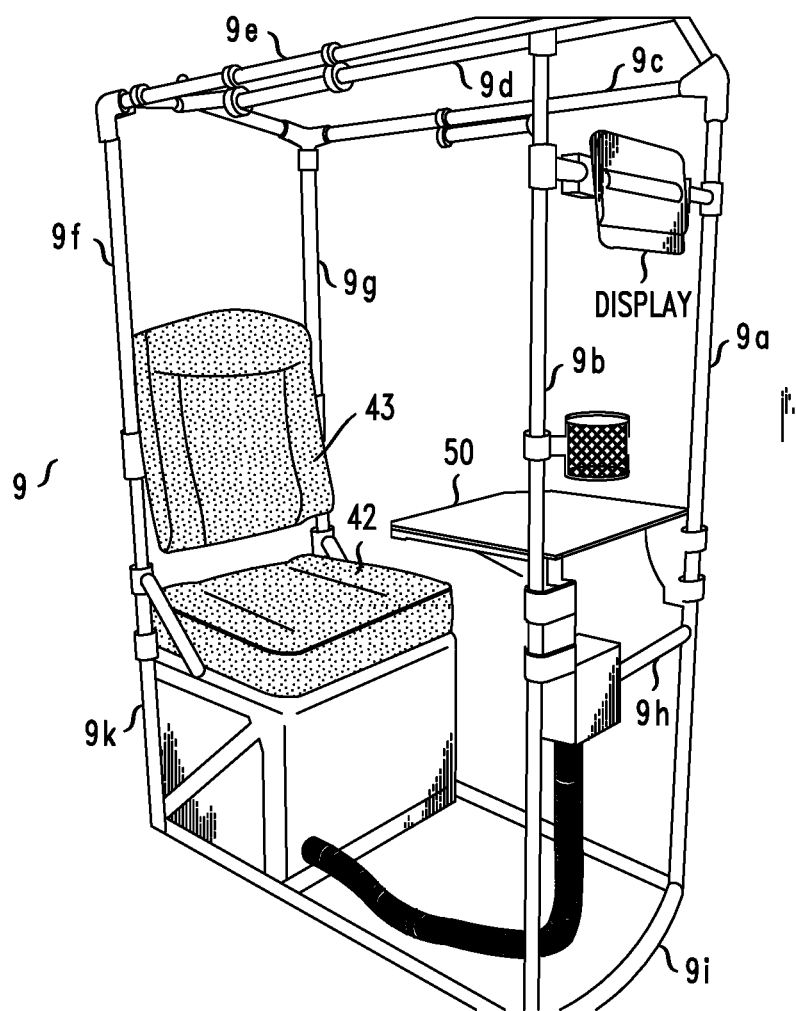
FIG. 2B depicts an exemplary lightweight frame for a compact, lightweight shielded enclosure according to an embodiment of the invention.

Referring now to FIG. 2B there is depicted an exemplary frame 9 according to an embodiment of the invention. It should be understood that each of the enclosures described herein or shown in the figures may include such an exemplary frame. It should be understood that the size of the frame 9 shown in FIG. 2A (as well as in FIGS. 7A and 7B) is merely exemplary (i.e., the size of the frame may vary depending on the size of the enclosure). As shown the frame 9 may comprise a multi-beam frame. For example, frame 9 may comprise a plurality of connected beams 9a to 9n (where "n" is the last beam). In one embodiment each of the beams 9a to 9n may comprise a lightweight, carbon-fiber material or fiberglass, for example, though other similar materials having the same or greater strength/rigidity and same or less density may be used.

It should be understood that inner structures provided by the present invention, such as structure 3 shown in FIGS. 1 and 2A may comprise an exemplary frame, such as frame 9, even though a frame is not shown in these figures.

Continuing, the multi-beam frame 9 may function to support one or more radio-frequency (RF) and other shielded layers (described elsewhere herein), and the electronics, lighting and personal electronics (also described elsewhere herein). Each of the layers or other components within an enclosure may be connected to the frame using known connection means or laid over the frame. Accordingly, because the frame provides a means of connecting and/or supporting the RF shielded layers and other elements, there is no need to connect the layers and elements to the housing (e.g., to housing 2a or 2b). This in turn eliminates or reduces the need to create an indentation, hole or other opening in the housing where unwanted signals may penetrate or confidential signals may escape. Further, because the frame 9 is supporting the layers and other elements forces on the housing are reduced. This helps maintain the structural integrity of the housing (i.e., the likelihood that the structure of the housing will be weakened or fail is reduced). It can be said that frames provided by the present invention allow the RF attenuation layers (and their respective function of attenuating RF signals) to be separated or decoupled, from the exterior protective housing that provides physical security.

In embodiments, each beam 9a to 9n may be hollow, (i.e., one or more beams of the multi-beam frame 9 may be hollow) though in other embodiments a beam may be substantially solid. It should be understood that the length, weight and cross-sectional dimensions (e.g., diameter) of a given beam may vary depending on the size of a given frame, load bearing requirements and position within a frame among things. The cross-sectional diameter of a beam 9a to 9n may circular in shape, though it should be understood that beams provided by the present invention may have various other cross-sectional shapes and dimensions, such as rectangular, triangular, hexagonal, etc., to name just a few examples. The cross-sectional dimensions of the beams provided by the present invention (and used as a part of each frame) may be varied to satisfy a given enclosure's shape, size, application, use and/or environment. In embodiments of the invention, the frame 9 may be configured so that the beams 9a to 9n provide a very strong structure, and multiple points of attachment for a shielded layer or other element.

The beams 9a to 9n may be connected together using lightweight connectors 90a to 90n (where "n" is the last connector). An exemplary connector may comprise a channel sections, where a beam 9a to 9n may be inserted and then fixed to the channel section using an adjustable pin or screw (not shown in figures). In one embodiment, each of the connectors 90a to 90n may comprise a carbon or nylon material. Depending on its location, a particular connector 90a to 90n may be configured as a corner connector or T-shaped connector.

In an embodiment, the housings and corresponding inner structure 3 that includes a multi-beam frame and connectors may form an integral, one-piece lightweight, protective enclosure when fabricated such that when the enclosure 1 is shipped to a site where it is to be used there may be no need to construct the housings and inner structure (along with its frame).

Figure 3:
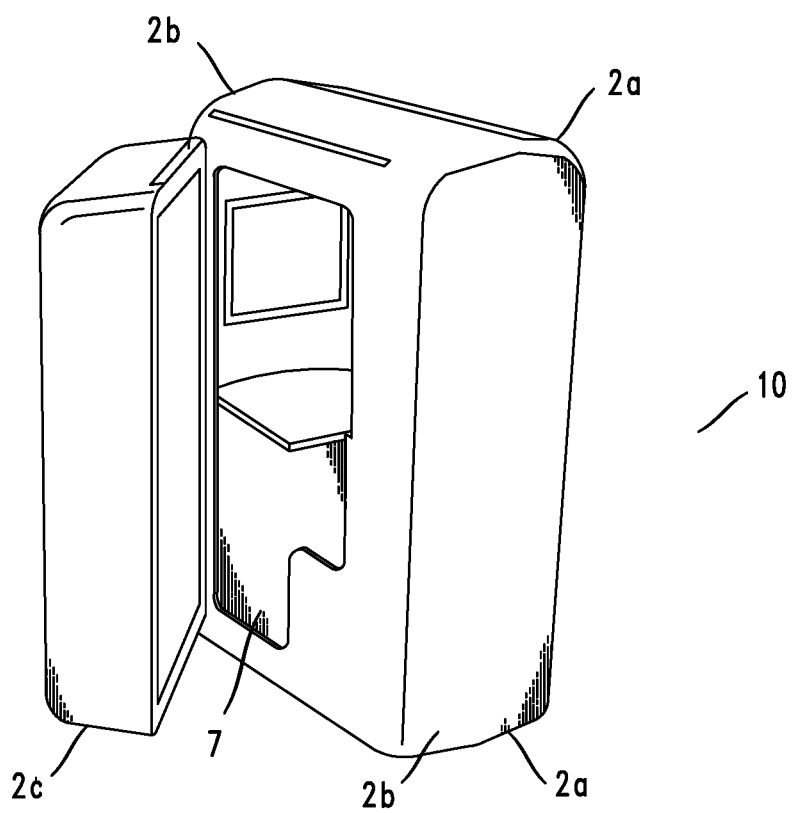
FIG. 3 depicts another view of a compact, lightweight shielded enclosure according to an embodiment of the invention.

Turning now to FIG. 3 there is depicted another exemplary compact, lightweight shielded enclosure 10 according to an embodiment of the invention. As shown, the enclosure 10 may include similar structure as enclosure 1, but, in addition includes a lightweight, protective cover 2c that may be operable to provide a level of physical security, cover opening 7 and function as a door. In an embodiment the cover/door may function to allow ingress to, or egress from, the enclosure 10 through the opening 7 in the housing 2b (or 2a) and may also comprise a carbon fiber or fiberglass material, for example, that has a high modulus of section per pound. Yet further, cover or door 2c (as well as other covers or doors described elsewhere herein) may comprise or be configured with fingerprint and card access electronics (e.g., see element 206 in FIG. 5B) and controls that restrict access to the enclosure 10 to only those authorized to enter. The access electronics and controls may be connected to electronics 6 to record the time and date of any opening and closing of the door 2c. Still further, the cover or door 2c may include positive locking mechanisms inside the enclosure 1 thereby making it difficult to penetrate the housings 2a,2b without leaving a mark (e.g. scratches). In an embodiment, housings, a corresponding inner structure that includes a multi-beam frame and connectors (not shown in FIG. 3), and door 2c may form an integral, one-piece lightweight, protective enclosure 10 when fabricated such that when the enclosure 10 is shipped to a site where it is to be used there may be no need to construct the housings and inner structure (along with its frame) and door 2c.

It should be understood that the inventive enclosures depicted in the figures herein may additionally comprise a material, materials or layers of one or more different material or materials that function to attenuate acoustic, EMI/RF, EMP and infrared signals, for example, and prevent penetration of chemical, biological and/or radioactive (CBR) gases and contaminants in order to form a secure environment within the enclosures. For example, one or more layers of a sound attenuation material (e.g., a mass loaded vinyl, sound deadening paint, melamine foam) may be positioned between the frame 9 and outer housings 2a,2b. In yet another embodiment, one or more layers of the sound attenuation material for attenuating acoustical signals may be integral to the outer housings 2a, 2b (see element 202 in FIGS. 5D and 5E). Further, one or more layers of an RF (and/or EMI, EMP) attenuation material 201 (e.g., a metallized fabric) for attenuating RF signals may be positioned over a frame, such as frame 9. In such an embodiment, when viewed in cross-section from the interior, RF attenuation layers substantially surround a frame, acoustical attenuation layers substantially surround the RF attenuation layers and housings substantially surround the acoustical attenuation layers. In alternative embodiments, the acoustical and RF attenuation layers may be reversed or intertwined to meet a specific design. Accordingly, it should be understood that housings, a cover/door, a corresponding inner structure that includes a multi-beam frame and connectors, one or more RF attenuation layers and one or more acoustical attenuation layers may form an integral, one-piece lightweight, shielded protective enclosure when fabricated such that when the enclosure is shipped to a site where it is to be used there may be no need to construct the housings, cover/door, inner structure (along with its frame and connectors) and layers—all are already constructed.

Figure 4A:
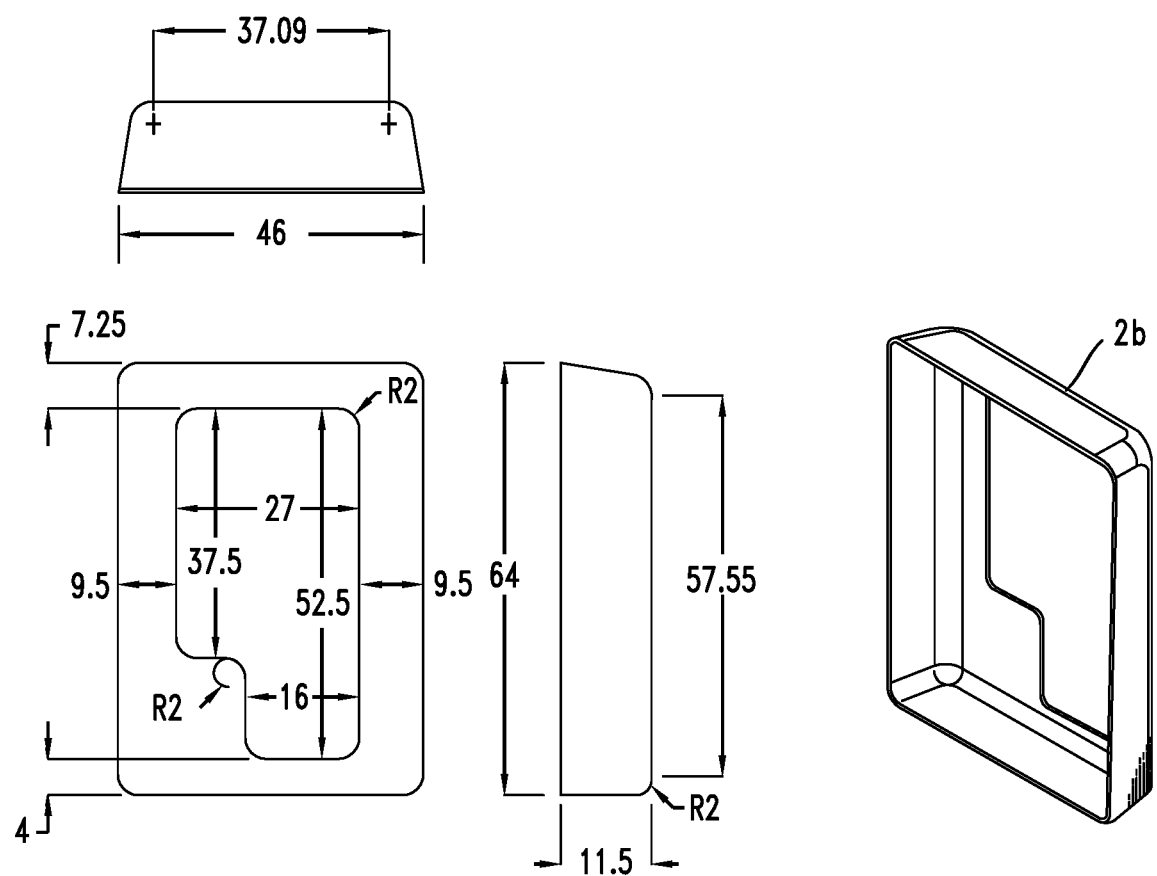
FIGS. 4A to 4D depict exemplary dimensions of components of compact, lightweight shielded enclosures according to embodiments of the invention.
Figure 4B:
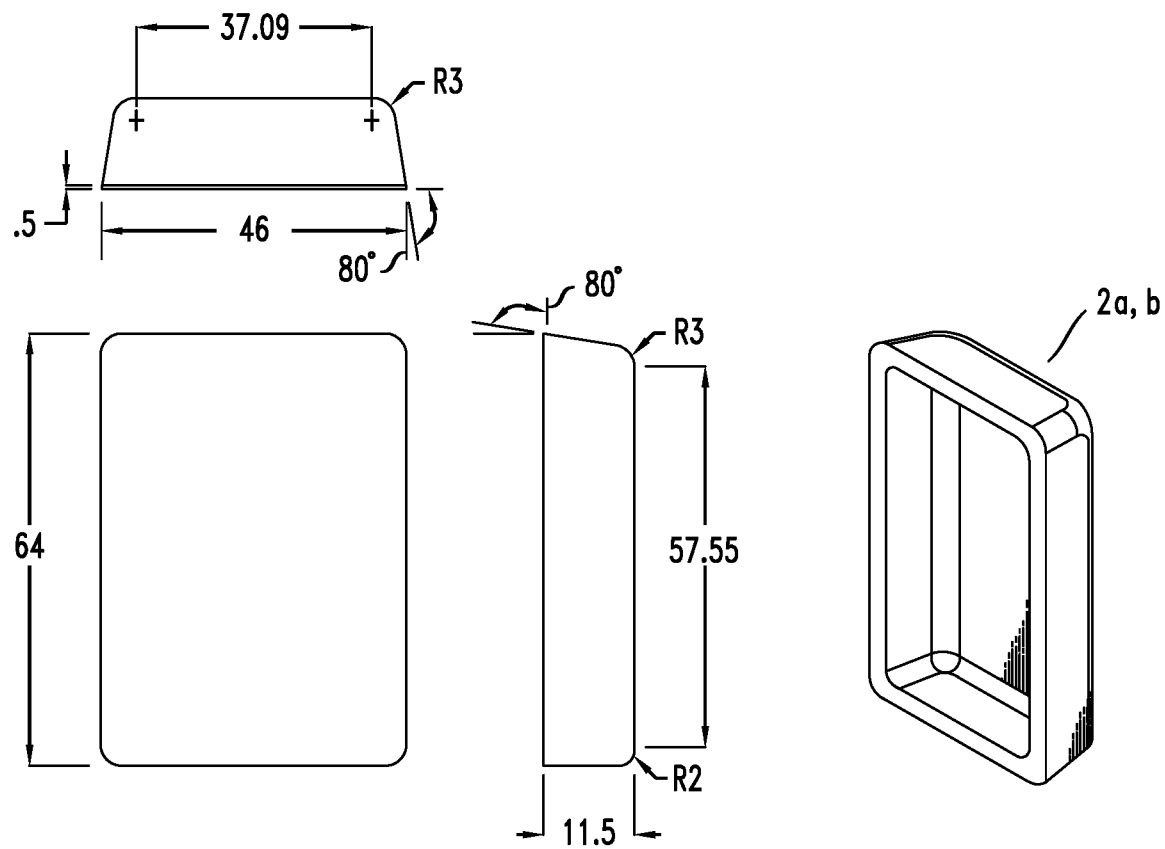
Figure 4C:
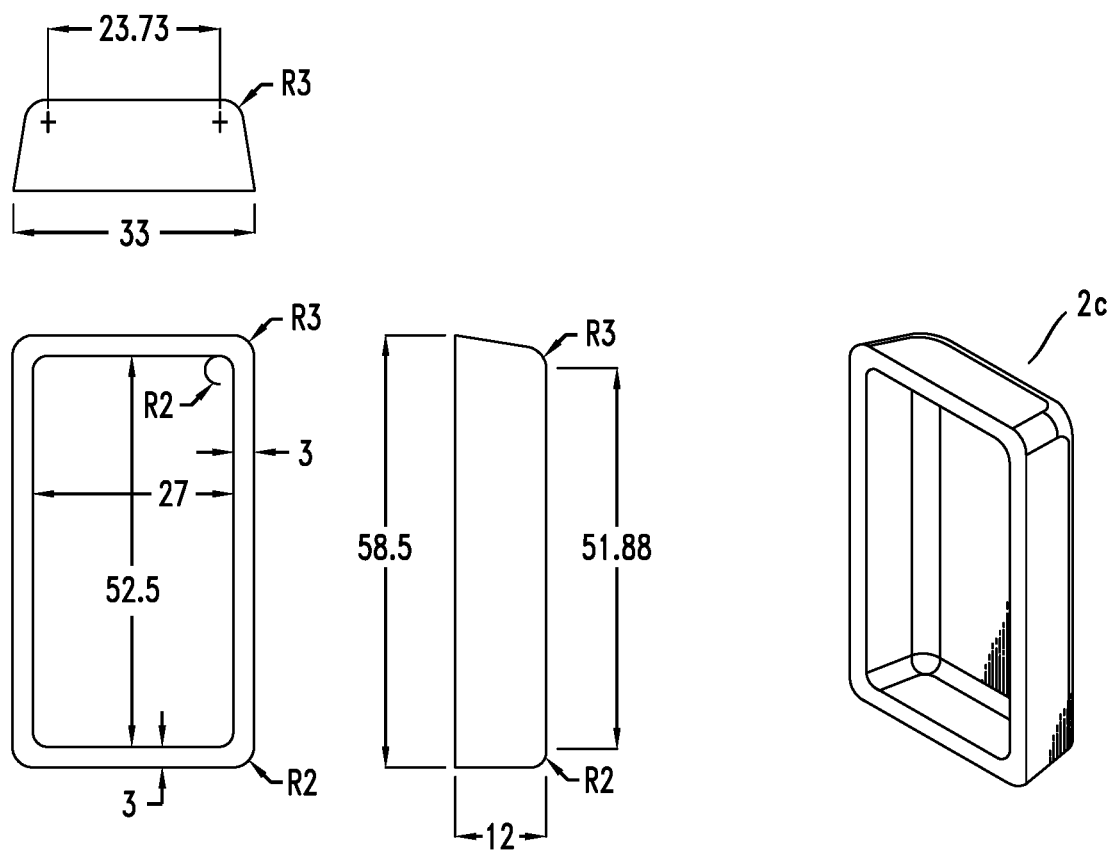
Figure 4D:
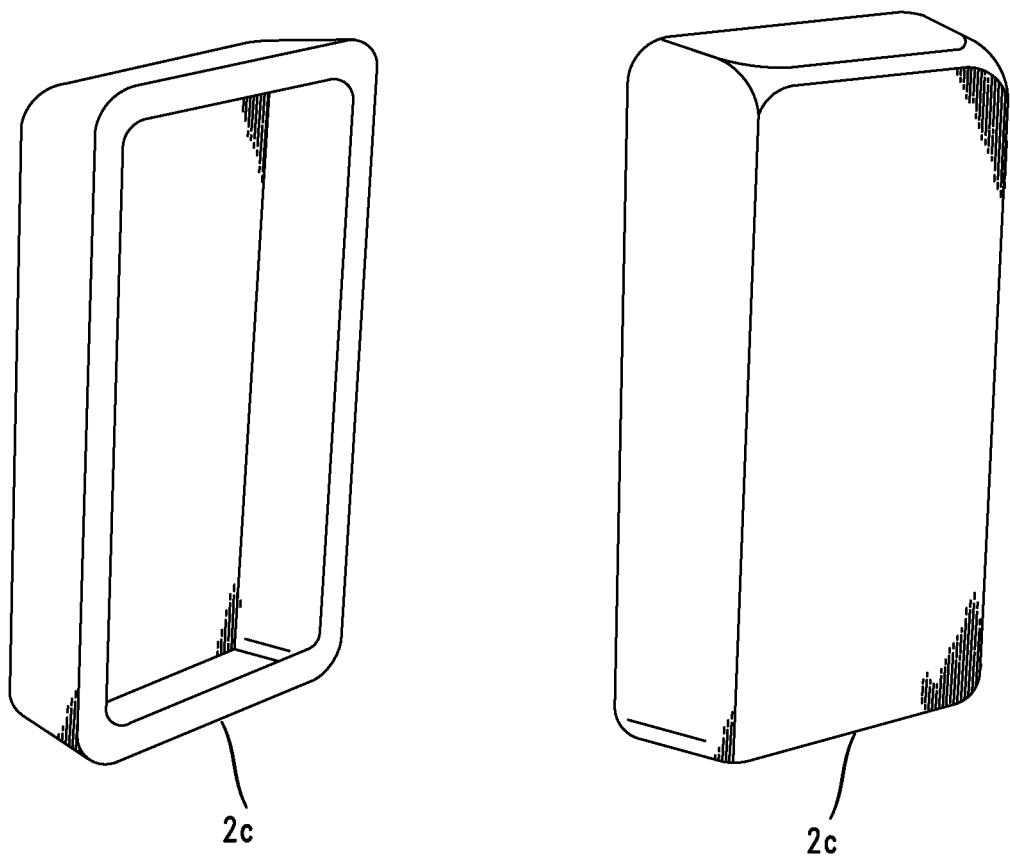

FIGS. 4A to 4D depict exemplary dimensions of components of an exemplary, compact, lightweight shielded enclosure. As shown, FIG. 4A depicts exemplary dimensions of a housing (e.g., housing 2b) while FIG. 4B depicts dimensions of an alternative housing 20a,b which may be used as a substitute or replacement for housings 2a,2b, for example. In FIG. 4C there is depicted exemplary dimensions of an exemplary cover (e.g., cover 2c) while FIG. 4D shows alternative views of an exemplary cover (e.g., cover 2c).

Figure 5A:
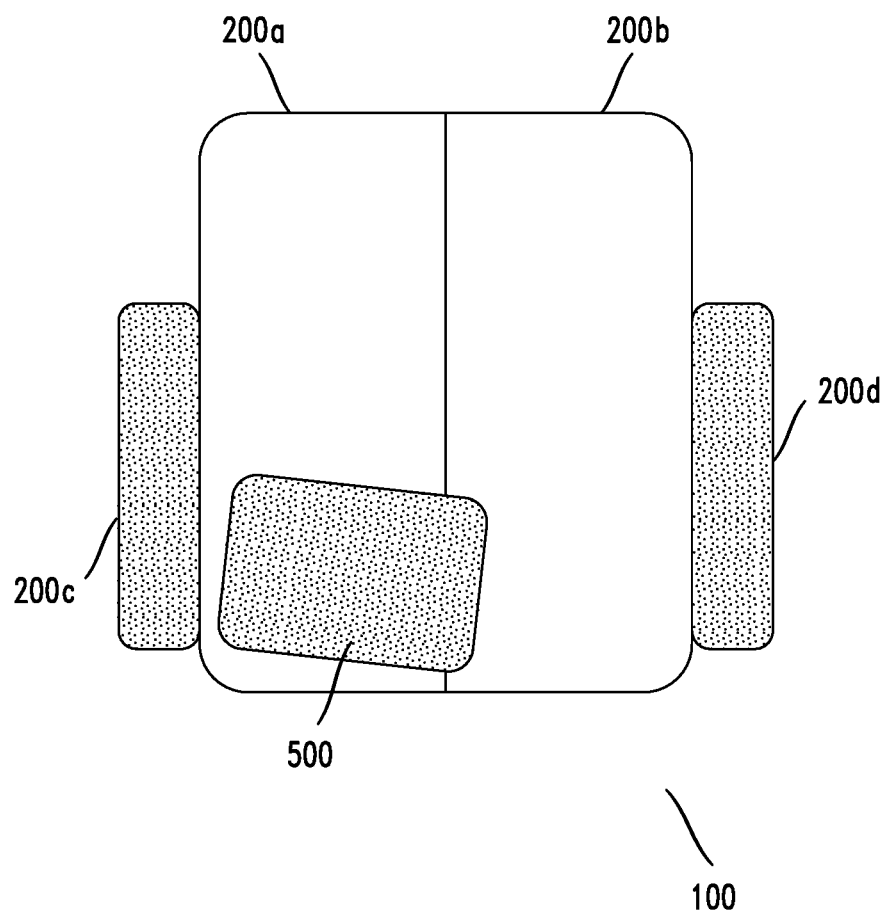
FIG. 5A depicts another compact, lightweight shielded enclosure according to yet another embodiment of the invention.

Though some embodiments shown in the figures depict a single cover or door 2c, it should be understood that the present invention provides embodiments that include more than one cover or door. For example, FIG. 5A depicts another exemplary compact, lightweight enclosure 100 that comprises first and second lightweight covers or doors 200c,d as well as housings 200a,b. Accordingly, the first and second lightweight covers 200c, 200d are each operable to function as a door to allow ingress to, and egress from, the enclosure through the corresponding openings in a corresponding housing 200a,b (openings similar to opening 7, but not shown in FIG. 5). Also shown is work area 500. It should be understood that the enclosure 100 may include an inner structure 300 (including a frame and connectors), attenuation layers and electronics, such as a computer, display and/or audio-visual equipment (see FIGS. 5B through 5D).

Alternatively, the second lightweight cover 200d may not function as a door but simply as an extension of housing 200b to add extra volume (interior space) to the enclosure 100.

Figure 5B:
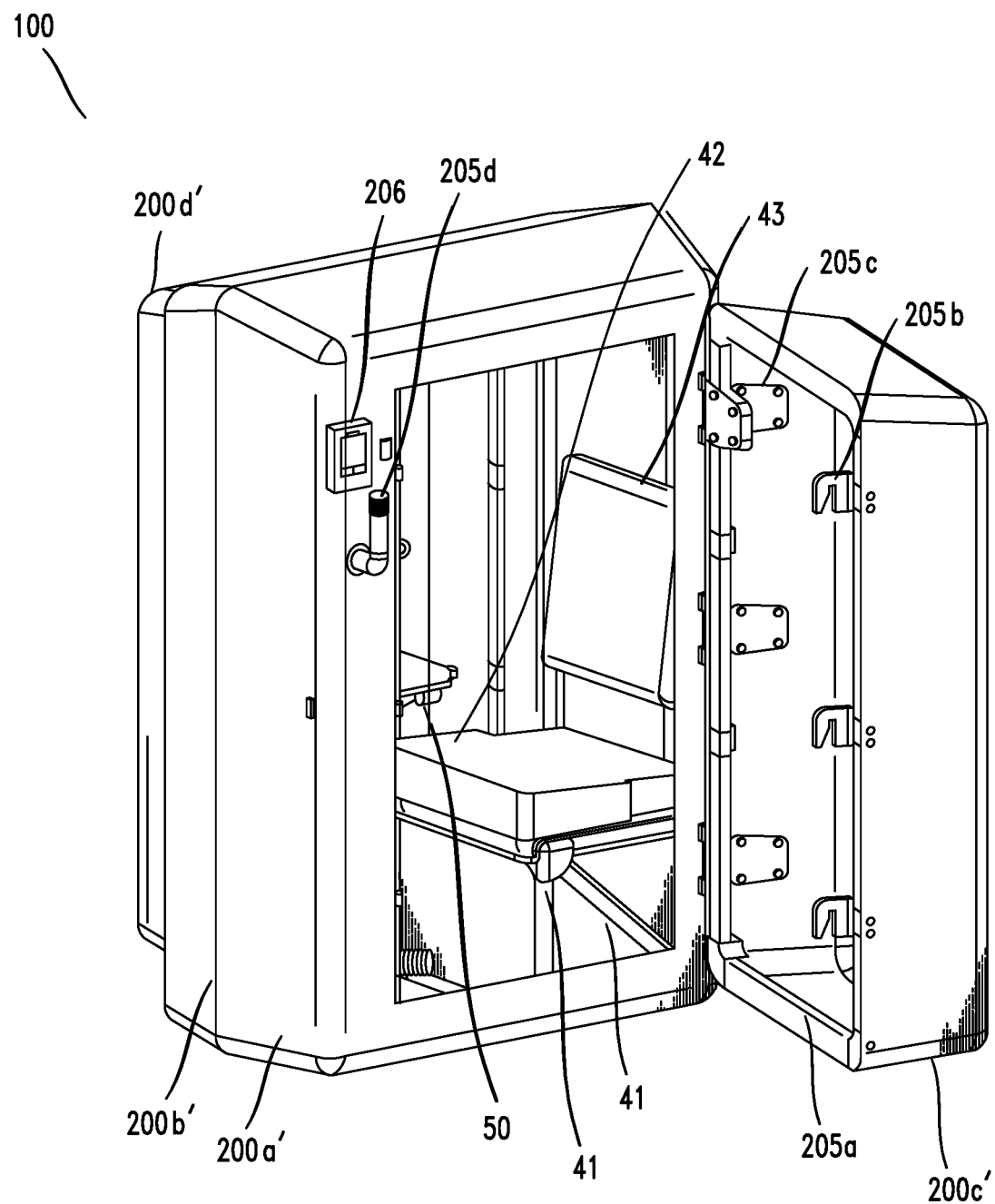

Referring now to FIG. 5B there is depicted a more detailed embodiment of the enclosure 100 shown in FIG. 5A. As shown the enclosure 100 may comprise a plurality of modules or components such as: a first lightweight, protective outer shell or housing 200a', a second lightweight, protective outer shell or housing 200b', a lightweight, protective outer cover or door 200c', a lightweight, protective outer extension 200d', an inner structure 300', personal support and sitting structure (e.g., seat) that comprises a base 41 that supports a top portion 42 and backrest 43, and a personal, adjustable (i.e., folding) work surface 50. In an embodiment, the volume of space formed by, and within, the enclosure 1oo may be sufficient to hold a single individual user though, as explained elsewhere herein, may be configured to hold more than one individual (e.g., a second individual). In an embodiment, the lightweight, protective outer housings 200a', 200b', cover/door 200c' and extension 200d' provides a level of physical security (e.g., a would be intruder cannot easily destroy each element to gain access to the interior of the enclosure) and stability to the enclosure 100. The housings 200a',200b', door 200c' and extension 200d' may comprise a carbon fiber or fiberglass material, for example, that has a high modulus of section per pound and may be connected together using connection means such as latches, for example, or may be formed as an integral unit. In an embodiment, the housings, extension, door, corresponding inner structure 300, (including frame and connectors), attenuation layers (not shown in FIG. 5B), personal support or sitting structure, and personal work surface may form an integral, one-piece lightweight, shielded protective structure when fabricated such that when the enclosure 100 is shipped to a site where it is to be used there may be no need to construct the elements just described—they are already constructed.

Elements 41 to 43 may comprise a carbon fiber or fiberglass material that is extremely light weight. In an embodiment, top portion 42 may rotate and whose height may be adjusted by the base 41. These features allow for ease of entry and exit from the enclosure 100, for example. Th top portion 42 may include a replaceable padding or padded covering for additional comfort or to absorb vibrations if the enclosure 100 is used as a part of moving vehicle, for example.

Still further, the personal sitting and support structure may include a hollow cavity (not shown in figure) that functions to allow insertion of, and holding of, electronics that are operable to make the enclosure electronically secure and actively, acoustically secure (e.g. 10 amp power filter), provide communications (e.g., signal filters, 5 way Ethernet filters), uninterruptible power supply, battery, active sound unit and/or that holds equipment that assist in conditioning the air inside the enclosure 1 (e.g., fans, air filters, cooling unit, along with waveguide vents on input and exhaust trunks (not shown in Figures), high level air filtering intake cartridges), and/or functions as a physical and/or electronic safe for holding confidential documents and/or sensitive equipment. It should be understood, however, that the electronics and equipment just described may be configured as a part of another section other than the personal sitting and support structure as well.

The enclosure 100 may further comprise one or more lights and light support structures (e.g., LED, ambient, reading light and "night" lights) and intensity controls and switches for illuminating the inside of the enclosure 100.

FIG. 5B depicts a view of the interior of the compact, lightweight shielded enclosure 100 according to an embodiment of the invention. As shown the enclosure 100 includes a personal workstation 50 for supporting personal electronics, such as a computer (laptop, desktop), display/monitor and/or audio-visual equipment operable to receive and send secure communications or relaxing entertainment content, for example. In addition, the equipment may comprise video monitoring equipment (e.g., surveillance cameras) that may be positioned within the enclosure 100 as well as the outside surface of a housing 200a', 200b' door 200c' or extension 200d'.

As shown in FIG. 5B the enclosure 100 may further comprise a mechanism for controlling the position of the door 200c'. In an embodiment the mechanism may comprise flange 205a, latches or hooks 205b, hinge 205c, latch handle 205d, latch pole 205e and gaskets 203 (see FIG. 5C). In an embodiment, to open the door 200c' from the interior of the enclosure 100 an occupant may lift the pole 205e from its resting place within the latches 205b thus freeing the door from the housing 200a'. Once the door 200c' is freed, it may be forced open by the occupant. Conversely, to close the door 200c' an individual on the exterior of the enclosure 100 may force the door 200c' towards the housing 200a'. Once a perimeter edge of the door 200c' is touching the housing 200a' the individual may move the latch handle 205d to a closed position. The latch handle comprises mechanical or electro-mechanical means for moving the pole 205e to a position within the latches 205b thus securing the door 200c' to the housing 200a'. Yet further, to ensure no electromagnetic signals emanate from the enclosure or penetrate the enclosure 100 through the perimeter of the door 200c', the enclosure 100 for comprising one or more sealing gaskets around the perimeter of the door 200c' (see element 203 in FIG. 5C). The combination of the closing mechanism and gaskets functions to form an RF seal around the perimeter edge of the door 200c'.

FIG. 5C depicts a close-up view of a mating of a part of door 200c' with the housing 200a', As shown, gaskets 203 may be affixed to the perimeter of the door 200c'. In the embodiment depicted in FIG. 5C, the gaskets 203 may be affixed to a portion of the surface of the RF attenuation layer 301. Further, the RF layer 301 may wrap around corners of the door that mate with the housing 200a' (the RF layer 401 of the housing may also wrap around an edge that mats with e the door 200c'). Accordingly, as the door 200c' is moved to a closed position the gaskets 203 come in contact with the housing 200a'.

Figure 5D:
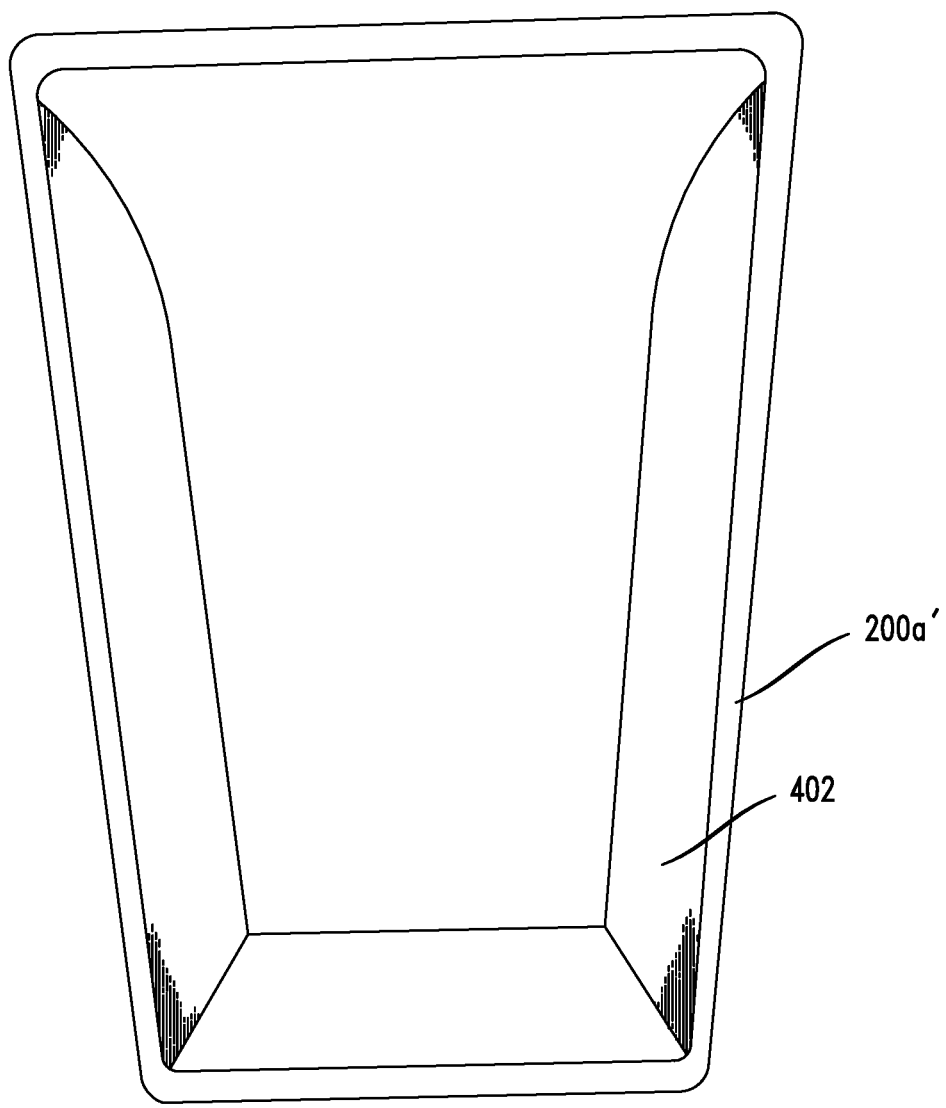
FIGS. 5D and 5E depict an exemplary housing and acoustical attenuation layer according to an embodiment of the invention.
Figure 5E:
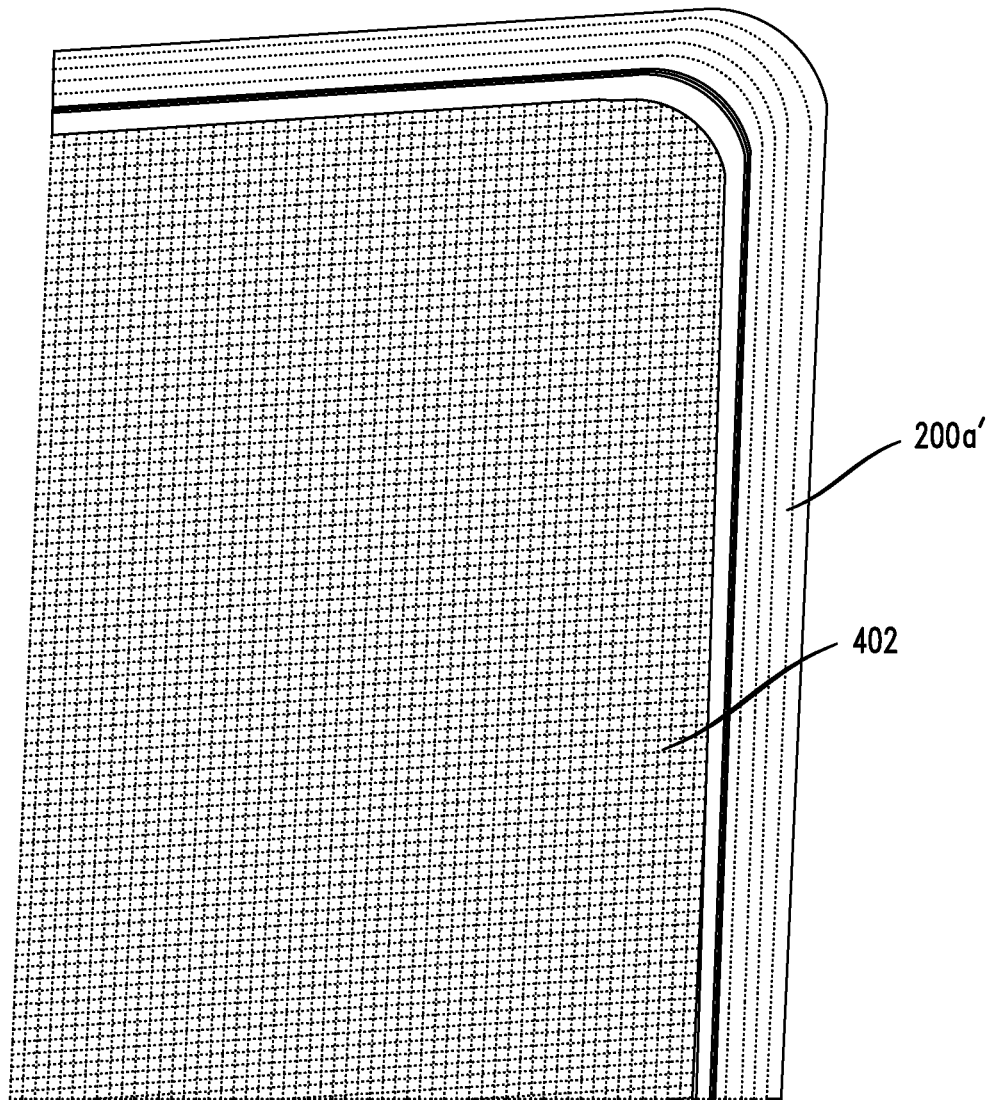

FIGS. 5D and 5E depict an exemplary placement of acoustical attenuation layers 402 on the interior surface of a housing 200a', for example. In embodiments of the invention, the enclosures depicted in FIGS. 5A through 5C may form an integral, one-piece lightweight, shielded protective enclosures when fabricated such that when the enclosures are shipped to a site where they are to be used there may be no need to construct the elements of the enclosures shown in FIGS. 5A to 5C.

Figure 6C:
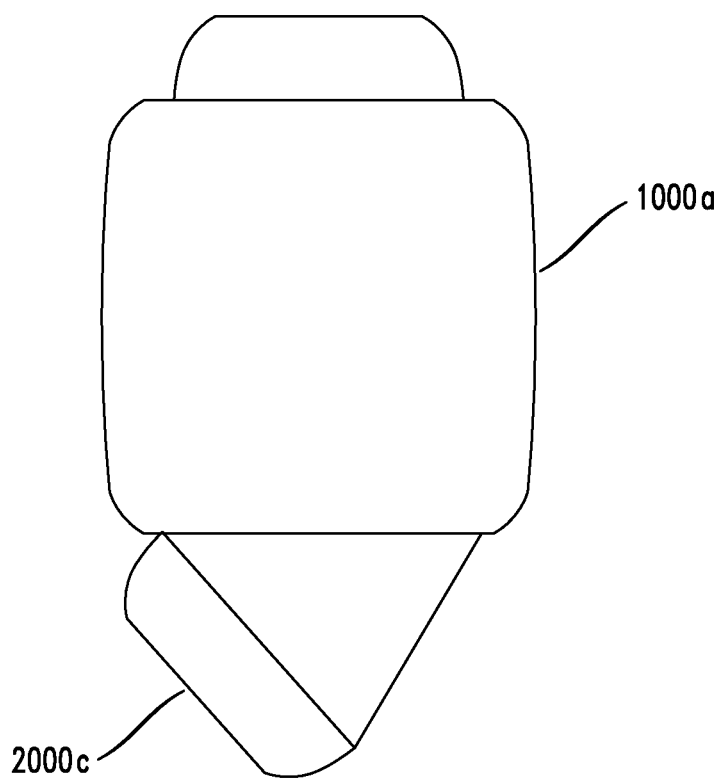

The present invention also provides compact enclosures that may hold two or more individuals or may provide for additional space for a single individual. For example, FIGS. 6A through 6C depict exemplary, compact enclosures that may provide additional space (i.e., interior volume) when compared to the enclosures described earlier. The enclosures may be configured to hold two individuals or a single individual, for example. Turning first to FIG. 6A, there is depicted a compact enclosure 1000 that may include first and second shells or housings 2000a,b, a cover or door 2000c and a spacer section 2000e configured or positioned between the housings 2000a,b and connected to the first and second housings 2000a,b. In the embodiments depicted in FIGS. 6A to 6C the addition of a spacer section 2000e provides greater volume to enclosure 1000 as compared to those enclosures shown in FIGS. 1 to 5 that do not include a spacer section. In an embodiment, the greater volume may be used to hold a second individual, additional space for a single individual, additional electronics or for storage of other material, for example.

Continuing, FIG. 6B depicts a compact enclosure 1000a that has similar features as enclosure 1000 in FIG. 6A and includes a second cover or door 2000d, support or seating structures 4000a,b (e.g. one per individual) and work areas 500a,b (again, one per individual). FIG. 6C depicts a top view of the enclosure 1000a. It should be understood that the housings and covers/door depicted in FIGS. 5 to 6C (as well as the other figures herein) may comprise a material, materials or layers of one or more different material or materials that function to attenuate acoustic, EMI/RF, EMP and infrared signals, for example, as described previously above to form a secure environment within the enclosures shown in FIGS. 5 to 6C (as well as the other enclosures in other figures described herein).

Figure 7A:
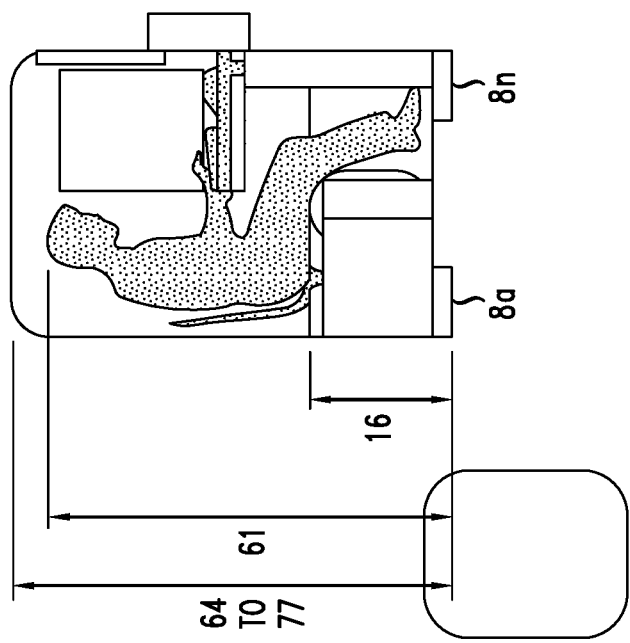
Figure 7A:
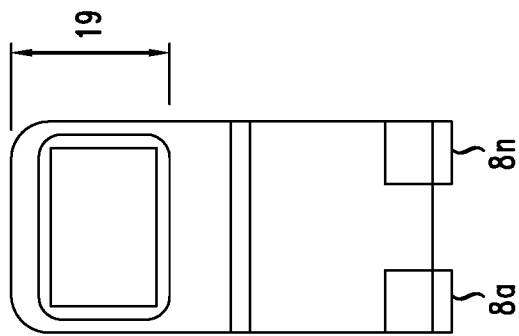

Exemplary dimensions of the enclosures set forth in FIGS. 1 through 5 are shown in FIGS. 7A to 7C while exemplary dimensions of the enclosures shown in FIGS. 6A to 6C are shown in FIG. 7D. Further, additional, exemplary dimensions are provided in Table 1 below:

Table 1
Example Enclosure 1:
External Dimensions: Width 33" Length 46" Height 64"
Internal Dimensions: Width 30" Length 43" Height 61"
Example Enclosure 2:
External Dimensions: Width 43" Length 46" Height 64"
Internal Dimensions: Width 40" Length 43" Height 61"
Example Enclosure 3:
External Dimensions: Width 68" Length 46" Height 64"
Internal Dimensions: Width 65" Length 43" Height 61"

As noted previously, however, the dimensions shown in FIGS. 7A to 7D as well as every other figure herein are merely exemplary to aid the reader in understanding the embodiments described herein. It should be understood, therefore, that such dimensions may be changed without departing from the scope of the invention. FIGS. 7A and 7B also depict pads 8a to 8n (where "n" represents the last pad) that function to provide support. In an embodiment, each of the enclosures described herein may include such pads, where the pads 8a to 8n may further comprise transparent pads (e.g. Plexiglass) to allow for easy inspection under an enclosure, for example.

To ensure that the users of enclosures provided by the present invention had sufficient space (volume) inside an inventive enclosure, to optimize ingress and egress from and to inventive enclosures, and to minimize claustrophobic structures, the inventors studied designs, data and statistics from the automotive, airline and industrial industries. In accordance with embodiments of the invention, the internal dimensions of the inventive enclosures maximize space while minimizing claustrophobia (see FIGS. 7A to 7D, for example) and the dimensions of the doors optimize ingress and egress. Further, the support structures and work areas included in enclosures provided by the present invention may be ergonomically configured to provide comfort for the user.

In embodiments of the invention, the enclosures depicted in FIGS. 6A through 7D may form integral, one-piece lightweight, shielded protective enclosures when fabricated such that when the enclosures are shipped to a site where they are to be used there may be no need to construct the elements of the enclosures shown in FIGS. 6A to 7D.

Due to the compact and lightweight nature of the modules/components of each enclosure described herein (e.g., less than 150 lbs.), enclosures provided by the present invention are easily set-up and installed. In an example, an inventive enclosure may be set-up by two people in less than one hour, for example.

The description above provides some examples of the scope of the present invention. It is not intended to be an exhaustive description of the many examples of the invention. Such a description would be impractical to write. That said, other compact, lightweight enclosures that include a different number of modules/components than the number shown in the figures herein or an integrated enclosure that includes two or fewer modules/components fall within the scope of the invention. Further, inventive packaging or containers for shipping the inventive enclosures fall within the scope of the invention. Variations of the examples given within are considered to be within the scope of the present invention.

What is claimed is:

1. An integral, lightweight radio-frequency (RF) and acoustically shielded enclosure comprising:
   a plurality of lightweight housings forming a structure connected together for providing at least physical security, the connected structure comprising at least one opening;
   an inner structure comprising a lightweight frame for supporting one or more RF attenuation layers for attenuating RF signals;
   one or more acoustical attenuation layers for attenuating acoustical signals; and
   a lightweight cover operable as a door to allow ingress to, and egress from, the enclosure through the at least one opening.

2. The enclosure as in claim 1 wherein the lightweight housings comprise a carbon fiber material or fiberglass.

3. The enclosure as in claim 1 wherein the lightweight cover comprises a carbon fiber material or fiberglass.

4. An integral, lightweight radio-frequency (RF) and acoustically shielded enclosure comprising:
   a plurality of lightweight housings forming a structure connected together for providing at least physical security, the connected structure comprising two openings;
   an inner structure comprising a lightweight frame for supporting one or more RF attenuation layers for attenuating RF signals;
   one or more acoustical attenuation layers for attenuating acoustical signals; and
   a plurality of lightweight covers, each operable as a door to allow ingress to, and egress from, the enclosure through one of the openings.

5. An integral, lightweight radio-frequency (RF) and acoustically shielded enclosure comprising:
   a plurality of lightweight housings forming a structure connected together for providing at least physical security, the connected structure comprising at least one opening;
   a spacer section configured between two of the housings;
   an inner structure comprising a lightweight frame for supporting one or more RF attenuation layers for attenuating RF signals;
   one or more acoustical attenuation layers for attenuating acoustical signals; and
   a lightweight cover operable as a door to allow ingress to, and egress from, the enclosure through the opening.

6. An integral, lightweight radio-frequency (RF) and acoustically shielded enclosure comprising:
   a plurality of lightweight housings forming a structure connected together for providing at least physical security, the connected structure comprising two openings;
   a spacer section configured between two of the housings;
   an inner structure comprising a lightweight frame for supporting one or more RF attenuation layers for attenuating RF signals;
   one or more acoustical attenuation layers for attenuating acoustical signals; and
   a plurality of lightweight covers, each operable as a door to allow ingress to, and egress from, the enclosure through one of the openings.

* * * * *